(12) United States Patent
Eisele et al.

(10) Patent No.: US 8,118,211 B2
(45) Date of Patent: Feb. 21, 2012

(54) METHOD FOR THE LOW-TEMPERATURE PRESSURE SINTERING OF ELECTRONIC UNITS TO HEAT SINKS

(75) Inventors: Ronald Eisele, Surendorf (DE); Mathias Kock, Gokels (DE)

(73) Assignee: Danfoss Silicon Power GmbH, Schleswig (DE)

( * ) Notice: Subject to any disclaimer, the term of this patent is extended or adjusted under 35 U.S.C. 154(b) by 0 days.

(21) Appl. No.: 12/866,121

(22) PCT Filed: Jan. 16, 2009

(86) PCT No.: PCT/DE2009/000050
§ 371 (c)(1),
(2), (4) Date: Sep. 16, 2010

(87) PCT Pub. No.: WO2009/100698
PCT Pub. Date: Aug. 20, 2009

(65) Prior Publication Data
US 2011/0017808 A1   Jan. 27, 2011

(30) Foreign Application Priority Data
Feb. 15, 2008  (DE) .......................... 10 2008 009 510

(51) Int. Cl.
*B23K 31/00* (2006.01)
*B23K 31/02* (2006.01)
(52) U.S. Cl. .................. 228/265; 228/179.1; 228/180.1; 228/248.1
(58) Field of Classification Search .................. 228/200, 228/234.1, 235.1
See application file for complete search history.

(56) References Cited

U.S. PATENT DOCUMENTS

| | | | | |
|---|---|---|---|---|
| 3,780,795 A | * | 12/1973 | Arnold | 165/80.2 |
| 4,856,185 A | * | 8/1989 | Baumgartner et al. | 29/840 |
| 5,158,226 A | * | 10/1992 | Schwarzbauer | 228/106 |
| 5,379,942 A | * | 1/1995 | Kuhnert et al. | 228/106 |
| 6,324,069 B1 | * | 11/2001 | Weber | 361/783 |
| 6,787,900 B2 | * | 9/2004 | Shinohara et al. | 257/718 |
| 7,205,177 B2 | * | 4/2007 | De Raedt et al. | 438/108 |

(Continued)

FOREIGN PATENT DOCUMENTS
DE        200 05 746 U1    9/2000
(Continued)

OTHER PUBLICATIONS

International Search Report for Serial No. PCT/DE2009/000050 dated Sep. 30, 2009.

*Primary Examiner* — Kiley Stoner
*Assistant Examiner* — Carlos Gamino
(74) *Attorney, Agent, or Firm* — McCormick, Paulding & Huber LLP

(57) ABSTRACT

A method for the low-temperature pressure sintering of at least one electronic unit to be contacted thermally, firmly connected mechanically, and located on a substrate, comprising the following steps: pressing the electronic unit using a mold enveloping matrix while sparing a connecting surface of the substrate for a heat sink connection, providing a heat sink plate, applying a sintering connecting layer onto the spared region of the connecting surface and/or onto to the region of the heat sink plate provided for contacting, and bonding of the heat sink plate to the substrate of the electronic unit in the region of the connecting surface using silver low-temperature pressure sintering technology.

7 Claims, 4 Drawing Sheets

U.S. PATENT DOCUMENTS

| | | | |
|---|---|---|---|
| 7,723,832 B2 * | 5/2010 | Ohuchi et al. | 257/686 |
| 7,766,218 B2 * | 8/2010 | Yamakawa et al. | 228/248.1 |
| 7,821,130 B2 * | 10/2010 | Hohlfeld et al. | 257/734 |
| 2003/0071348 A1 * | 4/2003 | Eguchi et al. | 257/723 |
| 2004/0026778 A1 | 2/2004 | Grant | |
| 2005/0067719 A1 | 3/2005 | Hayashi et al. | |

FOREIGN PATENT DOCUMENTS

| | | |
|---|---|---|
| DE | 102 00 372 A1 | 7/2003 |
| DE | 102005061773 B3 * | 5/2007 |
| DE | 10 2005 061 772 A1 | 7/2007 |
| DE | 10 2006 009 159 A1 | 8/2007 |
| EP | 0 693 776 A2 | 1/1996 |
| WO | 02/49104 A2 | 6/2002 |

* cited by examiner ic # METHOD FOR THE LOW-TEMPERATURE PRESSURE SINTERING OF ELECTRONIC UNITS TO HEAT SINKS

CROSS REFERENCE TO RELATED APPLICATIONS

This application is entitled to the benefit of and incorporates by reference essential subject matter disclosed in International Patent Application No. PCT/DE2009/000050 filed on Jan. 16, 2009 and German Patent Application No. 10 2008 009 510.9 filed Feb. 15, 2008.

FIELD OF THE INVENTION

The invention relates to a method for pressure sintering. Electronic units in power electronics with one or more semiconductor components are usually manufactured using glued connections, soldered connections or silver pressure-sintering technology of the unprotected semiconductor to a primary circuit support. In the process, preferably ceramic circuit supports are used (so-called DCB substrates or direct copper bonded substrates).

BACKGROUND OF THE INVENTION

The substrates consist of a core of aluminum oxide or aluminum nitride having coefficients of expansion of 7-8 ppm/K and approx. 4 ppm/K. The substrate can also be a purely ceramic solution in the form of thick-film hybrid supports from aluminum oxide or aluminum nitride having metallized or placed-on conductor tracks. Direct mounting of one or more semiconductors on a metallic lead frame as circuit support can also take place. US 2004-026778 A1 shows the direct mounting of the semiconductor on sections of the lead frame without insulating substrate.

The substrates consist of a core of aluminum oxide or aluminum nitride having coefficients of expansion of 7-8 ppm/K and approx. 4 ppm/K. The substrate can also be a purely ceramic solution in the form of thick-film hybrid supports from aluminum oxide or aluminum nitride having metallized or placed-on conductor tracks. Direct mounting of one or more semiconductors on a metallic lead frame as circuit support can also take place. US 2004-0026778 shows the direct mounting of the semiconductor on sections of the lead frame without insulating substrate.

In the case of a dynamic heat flow, the heat sink plate provides optimum energy buffering with the heat capacity of the selected material (preferably copper). In particular in the case of pulsed operation of the circuit, the heat sink plate reduces the dynamic thermal resistance (Zth). In the stationary case of a heat flow through power loss of these semiconductors, on the other hand the heat-spreading function is of importance. Here, the thermal conductivity of the heat spreading plate is decisive and its dimension that is increased relative to the substrate. This leads to an advantageous thermal resistance (Rth).

In the case of a dynamic heat flow, the heat sink plate provides optimum energy buffering with the heat capacity of the selected material (preferably copper). In particular in the case of pulsed operation of the circuit, the heat sink plate reduces the dynamic thermal resistance (Zth). In the stationary case of a heat flow through power loss of these semiconductors, on the other hand the heat-spreading function is of importance. Here, the thermal conductivity of the heat spreading plate is improved and its dimensions are increased relative to the substrate. This leads to an advantageous thermal resistance (Rth).

Some products also surround, in addition to the substrate unit, a mounted heat sink plate, e.g. DIP-IPM by Mitsubishi ("*A New Version Intelligent Power Module for High Performance Motor Control*"; M. Iwasaki et. al.; Power Semiconductor Device Division, Mitsubishi, Japan)

SUMMARY OF THE INVENTION

One disadvantage of the prior art that the present invention is solving is yielding losses by untested substrate units in the case of pressure sintering. In the case of a series or parallel connection of several substrate unites (multi-substrate module) on only one heat sink plate, it is particularly disadvantageous that for reasons of economic yield, only single units that have been tested electrically as good units can be mounted on a joint heat sink plate. This cost-saving manufacturing and testing step is not possible for mounting by means of silver pressure sintering, since the quasi-isostatic pressing of the unit during the sintering process would destroy the bond wires of the electrically wired unit.

To improve the prior art, it is proposed to shape the pretested substrate units at first into a robust, mechanically loadable unit (mold module) in the way described by shape-pressing.

Such a shape-pressed component can be connected by silver sintering with a heat sink plate by uni-axial or quasi-isostatic pressing by means of pressure sintering. In this design, only substrate units that have been tested to be good are processed further. This sintering process can be carried out using at least one mold module, but can, however, also be carried out simultaneously using several mold modules on only one heat sink plate.

Another disadvantage of the prior art that is resolved by the present invention is deformation of the surrounded unit with integrated heat sink plate as a result of large differences in expansion. a.) The process described of shape-pressing (transfer molding) has the disadvantage for the entire unit that renewed heating to approx. 170° C.-200° C. is carried out (thermal activation of polymer cross linking). In the process, the stack that has already been connected, consisting of the materials heat sink plate, connecting layer, substrate, connecting layer and semiconductor, is deformed in accordance to their individual coefficients of thermal expansion. The adhesion of the layers and the shear strength of the connecting layers provide for a permanent superimposed total deformation.

The preferred heat sink material is copper, and the high coefficient of expansion of the copper (18 ppm/K) leads to a hollow deformation of the material stack relative to a flat heat sink surface on which the latter unit is mounted at the end consumer.

Molding around the component by shape-pressing during the thermally deformed phase (at 175° C. to 200° C. process temperature) leads to a strongly inhibited re-formation of the hollow deformation. In part the mechanical shear stress between the material layers and the surrounding thermosetting plastic is so great that a destructive delamination between the cover and the layer stack and/or between the layers of the thermal stack takes place.

Even if no delamination sets in, after the process an interfering hollow deformation remains. This hollow deformation of a power-electronic unit relative to the flat cooling body has to be avoided at all costs, since the required heat flow for extracting heat from the transistors can no longer be guaranteed.

b.) Heat sink plates fulfill their function among others by heat spreading and as a function of the material also an increase in the total thermal capacity. To this end, the heat sink plate has to occupy a larger surface than the substrate plate represents that is connected thereon. For reasons of the rigidity that is aimed at, a thermosetting cover has to comprise the heat sink plate in a robust wall thickness, so that the heat sink plate appears flush-mounted on one side of the cover. However, the costs of the thermosetting mold compound are relatively high, so that the thermally required size of the heat sink plate is generally reduced to a degree that is inadmissible. In the known designs of such products, the heat spreading plates are mounted by an adhesive layer.

c.) Heat sink plates are on occasion also mounted externally by means of a thermally conducting paste below the substrate modules (mold-enveloped or also frame-based). However, due to the low thermal conductivity of pastes (1-5 W/mK) and the long-term stability of the pastes and their function (pump-out effect), this form-locking mounting is a disadvantage.

According to the invention, the following process steps are to avoid the disadvantages that have been mentioned and explicitly lead on the one hand to a reproducible convex deformation of the heat sink plate relative to a flat cooling body and on the other hand enable significant savings of the mold compound simultaneously with a correctly dimensioned heat sink plate.

The inventive method solves the problems above using the features of the main claim.

Here, the manufacturing process chain is changed in that the electronic unit without the heat sink plate (and without sintering connection layer to the heat sink plate) is press-molded with the thermosetting cover compound. The coefficient of expansion of the mold-envelope compound is now solely matched to the thermally dominant ceramic substrate (4 to 6 ppm/K) and now lies markedly below the coefficient of thermal expansion of the heat sink plate, preferably from copper (18 ppm/K).

A deformation by mismatching of the thermosetting plastic and the populated substrate is now no longer the case. The volume of the enveloped substrate is markedly less, and the material and energy consumption is correspondingly more economic and ecological (see FIGS. 1a, 1b with FIGS. 2a, 2b).

A heat sink plate can further be populated in a sintering process with several units that are connected in parallel electrically and enveloped individually.

DESCRIPTION OF THE DRAWINGS

Further advantages and features of the method result from the following description of a preferred exemplary embodiment. In the drawings.

DETAILED DESCRIPTION OF THE PREFERRED EMBODIMENTS

Figure 1A:
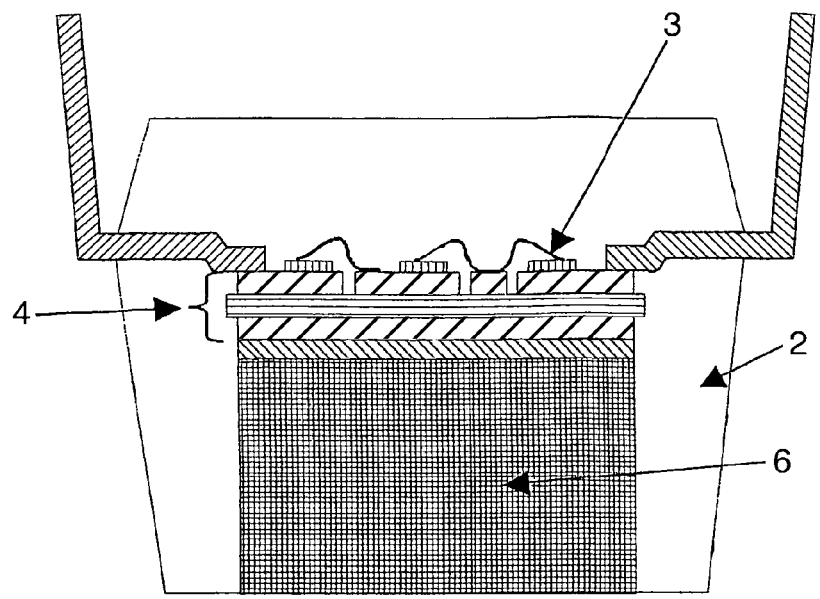
FIG. 1a shows the integration of the heat sink plate according to the prior art into the mold-enveloped body, with the disadvantage that the volume is great compared to the externally applied heat sink plate and the heat sink plate no longer has a spreading function.
Figure 1B:
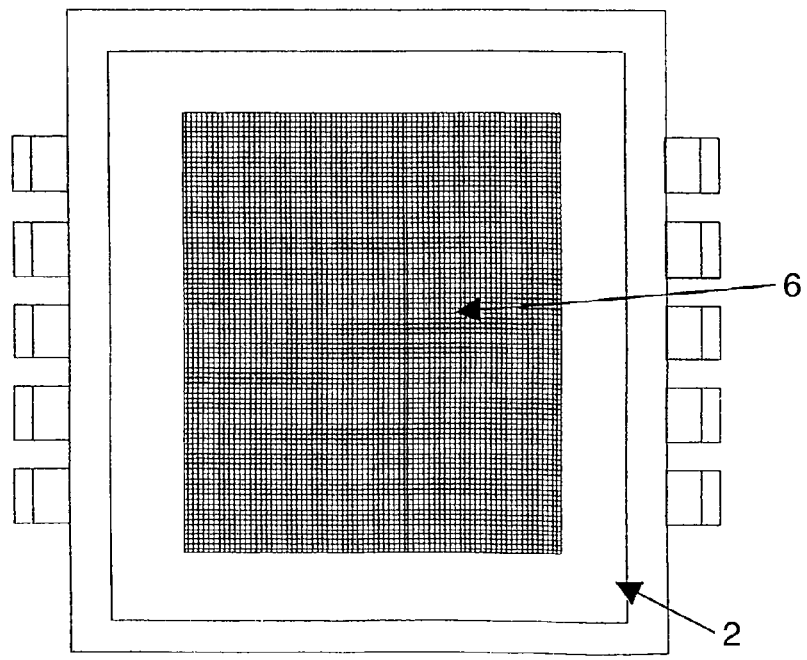
FIG. 1b shows that of FIG. 1a, but a view from the bottom of the heat sink plate.
Figure 2A:
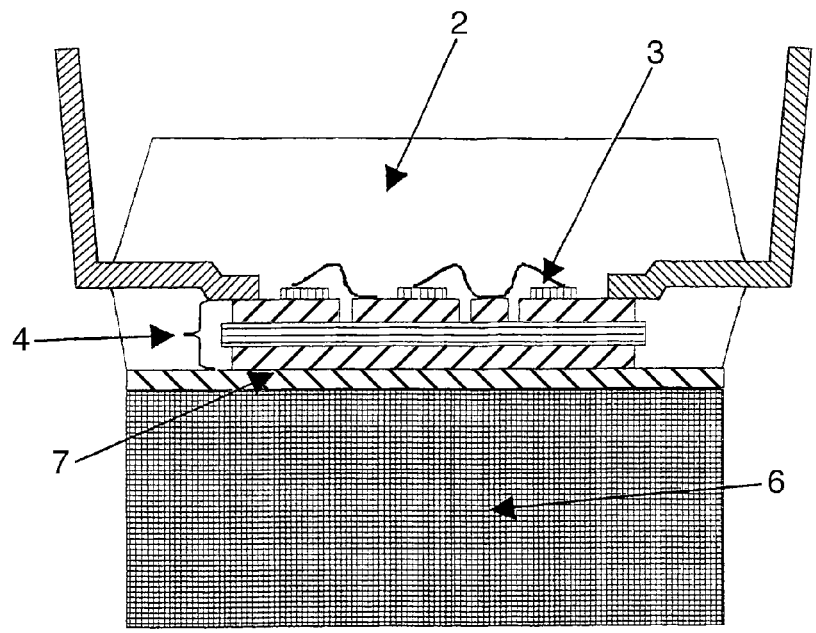
FIG. 2a shows an external bonded mounting of the heat sink plate to the finished mold-enveloped body, with the advantage that the volume of the thermosetting plastic is small relative to the volume in FIG. 1 and the connecting layer is a thermally highly conducting sintered silver layer.
Figure 2B:
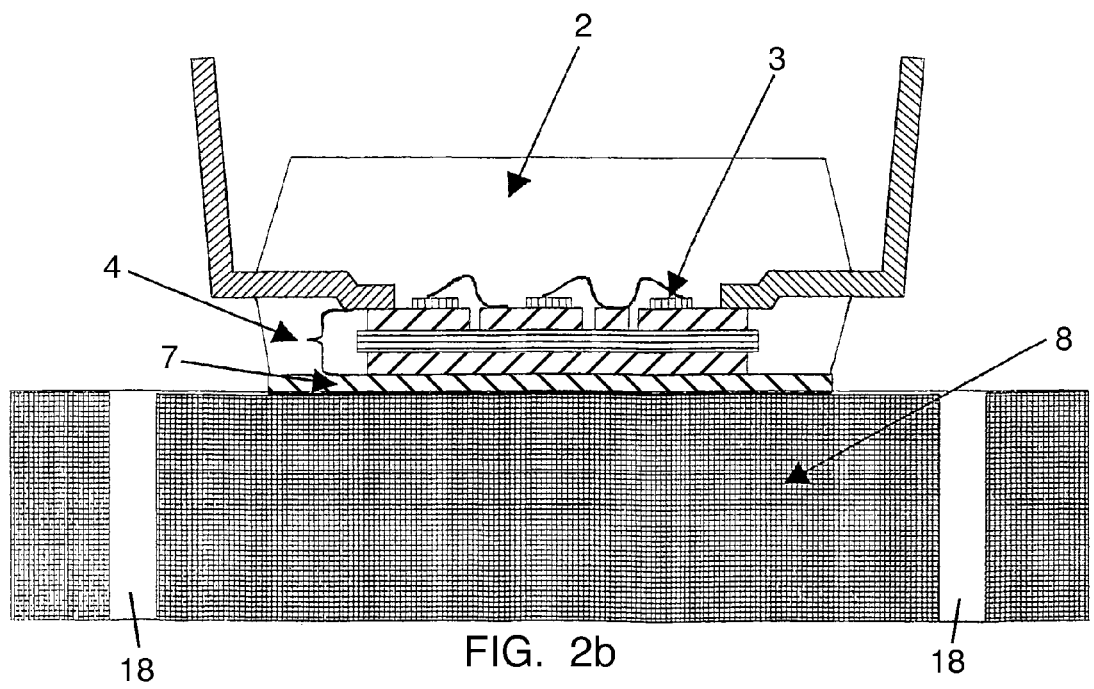
FIG. 2b shows an external bonded mounting of the increased-surface heat sink plate to the completed mold-enveloped body, with the advantages that the volume of the thermosetting plastic is small relative to the volume in FIG. 1, the connecting layer is a thermally highly conducting sintered silver layer, heat spreading is optimized further (relative to FIG. 2a) and a simple mounting possibility to a cooling body is given for example by screws.
Figure 3:
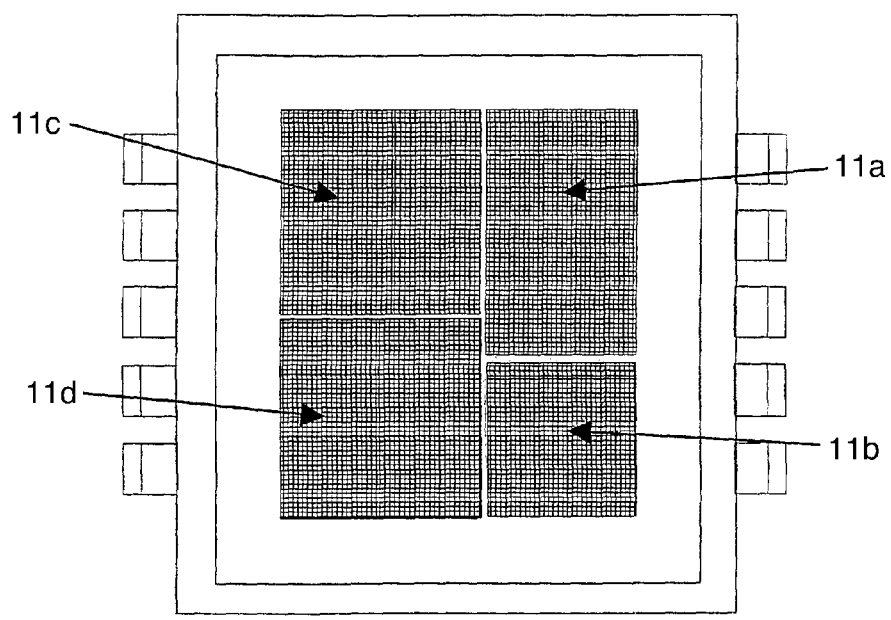
FIG. 3 shows an external bonded mounting of the increased-surface heat sink plate to the mold-enveloped body, with the additional advantages that the heat spreading plate is segmented and as a result of the small absolute size even the absolute expansion differences can be kept smaller. Reduced expansion differences mean smaller shear stresses and thereby also an increased service life relative to temperature cycling.
Figure 4:
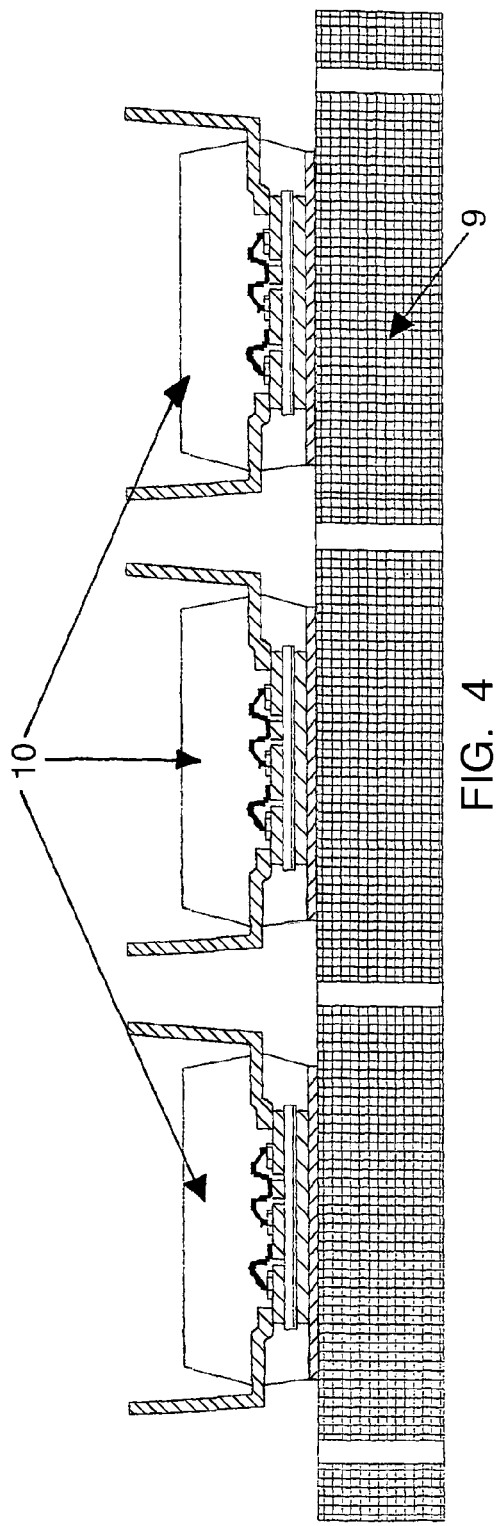
FIG. 4 shows an external bonded mounting of the increased-surface heat sink plate of several mold-enveloped bodies, with the advantage that now even multi-substrate modules from modules that have been tested individually to be good modules can be mounted in a bonded manner on a joint heat sink plate using the pressure sintering technology (here with multiple screw-on possibilities to create optimum compression forces to a cooling body)
Figure 5B:
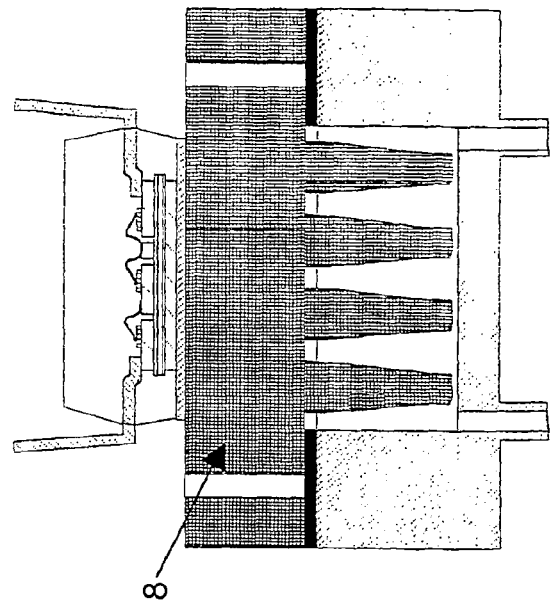
FIG. 5b shows—for direct water cooling—the heat sink plate of FIG. 4 to be provided with an additional tub of metal or plastic, into which water is guided.
Figure 5A:
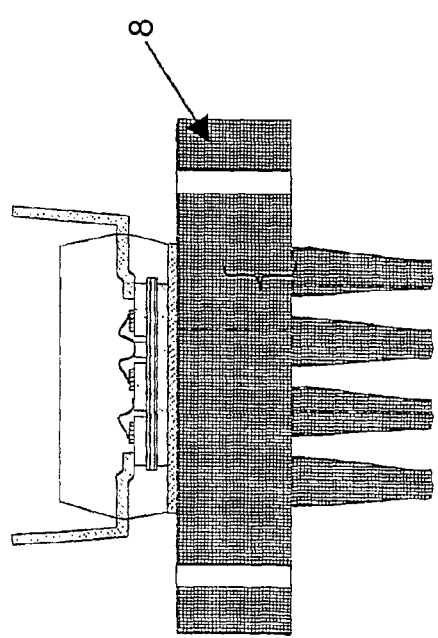
FIG. 5a shows the heat sink plate of FIG. 4, supplemented by surface-increasing structures such as fins or—shown—pins for air cooling.

The heat sink plate 6, 8 is now bonded in another connection process, that is the silver sinter pressure technology, to the completed mold-enveloped body 2 of the electronic unit 3 (and stable in the long term) (FIGS. 2a, 2b). The connecting layer of the sintered silver 7 typically has a thermal conductivity of about 250 W/mK and is thus thermally and mechanically far superior to any heat conducting paste and any adhesive and solder.

The heat sink plate 6, 8 can now be selected to have a sufficient size, that is to say at least identical to the substrate 4 size (primary function; high thermal capacity) or identical with the mold-enveloped body 2, or preferably also larger than the mold-enveloped body 2 (heat spreading and increase in the thermal capacity).

The pressure sintering technology connects by means of temperature and pressure. The pressure permits to press the heat sink plate 6, 8 into a bed (=lower press ram) with a smaller radius than results after the finished connection after cooling off. The heat sink plate 6, 8 springs into the radius of the lower ram; connects to the substrate 4 via the connecting layer 7 and assumes the final form after cooling off. The desired convex shape can now be influenced purposefully by the radius of the lower ram of the pressure sintering press.

The arrangement can be optimized using the following improvement measures:

If the heat sink 6, 8 is larger than the mold-enveloped body 2, the surface projecting beyond the body 2 can be provided with bores passages 18, for mounting screws.

The heat sink 6, 8 under a substrate plate 4 can be segmented. Preferably a part heat sink 11a, 11b, 11c, 11d that is in each case to be dimensioned to be at least identical with the surface requirement of the component is to be arranged under each heat dissipating component (transistor, diode) on the substrate 4. The individual part heat sinks 11*a*, 11*b*, 11*c*, 11*d* have smaller diagonals than the complete heat sink plate 6, 8 in the unsegmented state. The smaller heat sink plate diagonals of the part plates 11*a*, 11*b*, 11*c*, 11*d* have smaller shear stresses (as a result of a smaller absolute thermal difference expansion) relative to the substrate 4 and this leads to a larger temperature-cycling stability than can be achieved with a complete plate 6, 8.

For larger operating currents, it is also possible for more mold-enveloped components 10 to be attached on a heat sink plate 9 by pressure sintering and to be connected in parallel. In this way it is also possible to imitate conventional circuits, for example a B-6 bridge, and to attach them jointly on a heat sink plate 9 by pressure sintering technology.

As above however the heat sink plate is a pipe or a cooling-optimized hollow body through which a cooling medium can flow and thus increase the heat-withdrawing performance. As need be, the hollow space of the body must be prevented, by a removable support body (for example square-section rod in a rectangular tube), from being deformed during the pressure sintering process.

As f, however the heat sink body can be surrounded on several plan sides, preferably on the opposite surfaces, with shape-covering units in accordance with the pressure sintering principle. Thus for example a square pipe can carry power modules on two opposite sides.

Further a joint heat sink plate 9 can be populated in one sintering process with several units—for example—individually enveloped power electronic components 10 that are electrically connected in parallel.

While the present invention has been illustrated and described with respect to a particular embodiment thereof, it should be appreciated by those of ordinary skill in the art that various modifications to this invention may be made without departing from the spirit and scope of the present.

What is claimed is:

1. A method for low-temperature pressure sintering of at least one electronic unit, comprising the following steps:

locating the electronic unit on a thermally dominant ceramic substrate, and thermally contacting and mechanically connecting the electronic unit and the substrate;

shape-pressing the electronic unit using a mold enveloping compound at a process temperature of 175° C. to 200° C. whilst sparing a connecting surface of the substrate for a heat sink connection, the coefficient of expansion of the mold enveloping compound being matched to the substrate, providing a heat sink plate, applying a sintering connecting layer onto a spared region of the connecting surface and/or to a region of the heat sink plate provided for contacting, and bonding the heat sink plate to the substrate in the spared region of the connecting surface using silver low-temperature pressure sintering technology, using a lower press ram with a smaller radius/outside dimensions than the heat sink plate for applying pressure for warping the heat sink plate, so that after cooling the sinter connection, convex warping of the heat sink plate is produced.

2. The method according to claim 1, wherein passages are provided in the heat sink plate for mounting screws for mechanically fixing the heat sink plate to further heat-dissipating components.

3. The method according to claim 1, wherein several, individually enveloped electronic units are sintered onto a joint heat sink plate in a joint sintering step.

4. The method according to claim 1, wherein the heat sink is segmented under the substrate.

5. The method according to claim 1, wherein the heat sink plate is a pipe or a cooling hollow body through which a cooling medium flows.

6. The method according to claim 5, wherein the convex warping of the cooling hollow body during the pressure sintering process is limited by a support body.

7. The method according to claim 5, wherein the cooling hollow body that forms the heat sink plate and through which a cooling medium flows carries power modules on its opposite faces.

\* \* \* \* \*